United States Patent
Jou et al.

(10) Patent No.: US 10,379,156 B2
(45) Date of Patent: Aug. 13, 2019

(54) BUMP BALL TESTING SYSTEM AND METHOD

(71) Applicant: TAIWAN SEMICONDUCTOR MANUFACTURING COMPANY, LTD., Hsinchu (TW)

(72) Inventors: Chewn-Pu Jou, Hsinchu (TW); Min-Jer Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 173 days.

(21) Appl. No.: 14/815,038

(22) Filed: Jul. 31, 2015

(65) Prior Publication Data
US 2016/0349313 A1    Dec. 1, 2016

Related U.S. Application Data

(60) Provisional application No. 62/168,475, filed on May 29, 2015.

(51) Int. Cl.
*G01R 31/28* (2006.01)

(52) U.S. Cl.
CPC ..... *G01R 31/2853* (2013.01); *G01R 31/2856* (2013.01); *G01R 31/2884* (2013.01)

(58) Field of Classification Search
CPC ............ G01R 31/2853; G01R 31/2884; G01R 31/2856
USPC ...................................................... 324/750.3
See application file for complete search history.

(56) References Cited

U.S. PATENT DOCUMENTS

| | | | | |
|---|---|---|---|---|
| 6,025,730 A * | 2/2000 | Akram | ............... | G01R 31/2886 324/750.25 |
| 6,452,502 B1 * | 9/2002 | Dishongh | .......... | G01R 31/2856 228/104 |
| 6,630,832 B1 * | 10/2003 | Harzanu | ............ | G01R 31/2805 324/754.27 |
| 6,867,608 B2 * | 3/2005 | Richmond, II | .... | G01R 31/2863 324/750.3 |
| 7,501,832 B2 * | 3/2009 | Spuhler | ................ | G01R 31/048 324/762.02 |
| 7,557,596 B2 * | 7/2009 | Eldridge | ............ | G01R 1/07307 324/750.3 |

(Continued)

OTHER PUBLICATIONS

Liu et al. ("A new method for fabricating ultrathin metal films as scratch-resistant) flexible transparent electrodes"; Published Apr. 1, 2015; Journal of Materiomics 1; [2015] 52-59, herein Liu).*

*Primary Examiner* — Melissa J Koval
*Assistant Examiner* — Rahul Maini
(74) *Attorney, Agent, or Firm* — Hauptman Ham, LLP

(57) ABSTRACT

An integrated circuit testing system includes a conductive structure, a conductive pad electrically connected with the conductive structure, a test circuit electrically connected with the conductive pad, a conductive line electrically connected with the conductive structure, the conductive line being configured to be connected with a ground, and a controller coupled with the test circuit. The controller is configured to selectively cause the test circuit to supply a voltage to the conductive structure via the conductive pad. The test circuit is configured to provide feedback to the controller indicative of whether the conductive structure is electrically connected with the conductive pad.

20 Claims, 10 Drawing Sheets

(56) References Cited

U.S. PATENT DOCUMENTS

| | | | |
|---|---|---|---|
| 8,448,100 B1 | 5/2013 | Lin et al. | |
| 8,580,088 B2 * | 11/2013 | Haishi | C23C 14/086 |
| | | | 204/192.15 |
| 8,631,372 B2 | 1/2014 | Yu et al. | |
| 8,669,780 B2 | 3/2014 | Chi | |
| 8,701,073 B1 | 4/2014 | Fu et al. | |
| 8,749,254 B2 * | 6/2014 | Su | G01R 31/2849 |
| | | | 324/750.03 |
| 8,754,818 B2 | 6/2014 | Yen et al. | |
| 9,024,315 B2 * | 5/2015 | Yao | G01R 31/31717 |
| | | | 257/48 |
| 9,111,895 B2 * | 8/2015 | Pagani | G01R 31/2853 |
| 9,329,227 B2 * | 5/2016 | Xie | G01R 31/2853 |
| 2007/0200571 A1 * | 8/2007 | Quinn | G01R 31/31926 |
| | | | 324/754.1 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0043148 A1 | 2/2014 | Wang et al. | |
| 2014/0077057 A1 | 3/2014 | Chao et al. | |
| 2014/0092939 A1 | 4/2014 | Chang et al. | |
| 2014/0126089 A1 | 5/2014 | Chang et al. | |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0203397 A1 | 7/2014 | Yen et al. | |
| 2014/0211438 A1 | 7/2014 | Lin et al. | |
| 2014/0239427 A1 | 8/2014 | Huang et al. | |
| 2014/0264772 A1 | 9/2014 | Horng et al. | |
| 2014/0266273 A1 | 9/2014 | Wang et al. | |
| 2015/0019927 A1 * | 1/2015 | Hsu | G01R 31/2863 |
| | | | 714/724 |
| 2015/0070046 A1 * | 3/2015 | Takano | H01L 23/552 |
| | | | 324/762.01 |

\* cited by examiner

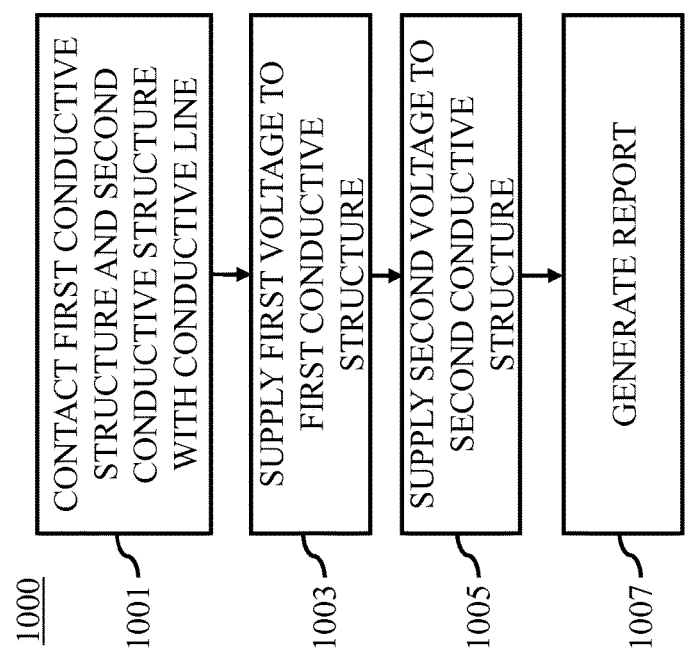

BUMP BALL TESTING SYSTEM AND METHOD

BACKGROUND

Integrated circuits (IC's) sometimes include bump ball interconnection structures. The bump ball interconnection structures are usually included in IC's to provide electrical connections between various features of the IC. Sometimes, the bump ball interconnection structures are used to provide electrical connections between the IC and an external device or other integrated circuit. Manufacturing defects sometimes result in a bump ball interconnection structure being incapable of providing a designed electrical connection. For example, sometimes a bump ball interconnection structure is manufactured in a manner or damaged by a testing mechanism that results in a failed electrical connection. As such, some IC testing systems and methods provide ways to test whether a bump ball interconnection structure is capable of carrying a voltage. Some IC testing systems and methods use complicated and expensive test pins or probes to test for electrical connectivity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of a method of testing an IC, in accordance with one or more embodiments.

DETAILED DESCRIPTION

Figure 1:
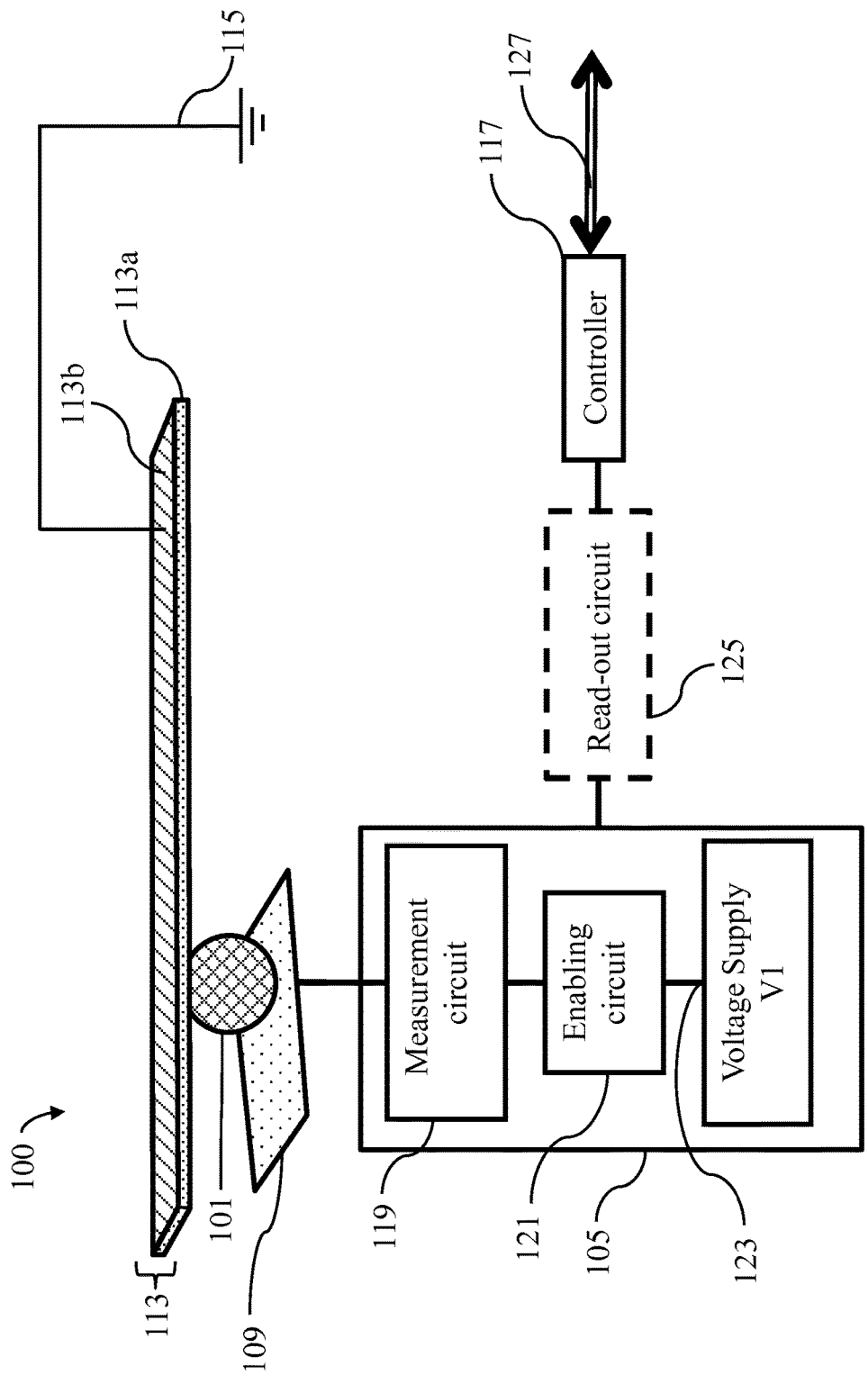
FIG. 1 is a diagram of an integrated circuit (IC) testing system, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Integrated circuits (ICs) sometimes include bump ball interconnection structures. The bump ball interconnection structures are usually included in ICs to provide electrical connections between various features of the IC. Sometimes, the bump ball interconnection structures are used to provide electrical connections between the IC and an external device or other integrated circuit. Testing whether the bump ball interconnection structures are properly manufactured such that the bump ball interconnection structures provide a designed electrical connectivity is often difficult because the bump ball interconnection structures have curved surfaces.

Some IC test systems and methods use complex test pins like pogo pins or cobra pins that have flexible mechanical structures. The flexible mechanical structures are intended to provide a way to contact the curved surface of the bump ball interconnection structure. Pogo pins and cobra pins; however, sometimes mar the bump ball interconnection structure, which degrades the reliability of the bump ball interconnection structure.

In some embodiments, bump ball interconnection structures are spaced from one another by at least 100 micrometers. As ICs are designed with a greater quantity of input/output pins, and as the overall size of ICs and various components thereof such as complementary metal oxide semiconductor (CMOS) transistors decrease, the distance between bump ball interconnection structures decreases. In some embodiments, the distance between bump ball interconnection structures is less than 100 micrometers.

Test pins (also referred to as test probes) with flexible mechanical structures, such as pogo pins and cobra pins, are difficult to fabricate efficiently to test bump ball interconnection structures that are spaced from one another by less than 100 micrometers. Additionally, IC testing systems that use test pins are often expensive. For example, pogo pins include springs to enhance the flexibility of the test pin. Springs having a diameter of less than 100 micrometers are difficult to manufacture. Furthermore, a test pin that includes such a spring is difficult to assemble. Additionally, as the distance between bump ball interconnection structures decreases, the diameter of such bump ball interconnection structures also decreases. The smaller the diameter of the bump ball interconnection structure, the more susceptible the bump ball interconnection structure is to marring or other structural blemishes that reduce the effectiveness of the bump ball interconnection structure in making an electrical connection.

To avoid contacting the bump ball interconnection structures, some IC's have contact pads that are configured to be touched with a test pin. These contact pads extend beyond the diameter of the bump ball interconnection structure such that the contact pad is capable of being touched by the test pin. In at least some embodiments, the contact pad is capable of being touched by the test pin without contacting the bump ball interconnection structure. In some embodiments, extended contact pads increase the size of the IC without an increase in the functionality of the IC.

FIG. 1 is a diagram of an IC testing system 100, in accordance with one or more embodiments. IC testing system 100 is configured to enable the testing of the electrical connectivity of an interconnection structure without having to contact the interconnection structure with a test pin that could damage the interconnection structure. In some embodiments, IC testing system 100 is configured to test a current flow through the interconnection structure without having to contact the interconnection structure with a test pin. In some embodiments, IC testing system 100 is configured to determine whether a current flow through the interconnection structure exceeds a predetermined threshold value without having to contact the interconnection structure with a test pin.

In some embodiments, IC testing system 100 is configured to test whether an interconnection structure is capable of carrying a voltage without having to contact the interconnection structure with a test pin that could damage the interconnection structure. In some embodiments, IC testing system 100 helps to facilitate testing whether an interconnection structure is capable of carrying a voltage where interconnection structures included in the IC are spaced by distances that are less than 100 micrometers. In some embodiments, IC testing system 100 is also capable of being used to test whether an interconnection structure is capable of carrying a voltage where the interconnection structures included in the IC are spaced by distances of at least 100 micrometers.

IC testing system 100 comprises a test circuit 105 connected via a conductive pad 109 to a conductive structure 101. Test circuit 105 is configured to test electrical connectivity between the conductive structure 101 and conductive pad 109. Test circuit 105 is configured to supply a voltage to conductive structure 101 via conductive pad 109 and measure a current flow to a ground 115 connected to the conductive structure via a conductive line 113. In some embodiments, test circuit 105 is a built-in-self test circuit. In some embodiments, test circuit 105 is configured to test electrical connectivity between the conductive structure 101 and conductive line 113.

In some embodiments, conductive pad 109 is an under bump layer. In some embodiments, conductive pad 109 comprises one or more of copper, gold, aluminum or another suitable electrically conductive material.

In some embodiments, the conductive structure 101 is a bump ball. In some embodiments, the bump ball has a curved surface in contact with the conductive line 113. In some embodiments, the bump ball comprises solder. In some embodiments, the conductive structure 101 is a solder bump. In some embodiments, the conductive structure 101 is a conductive pillar. In some embodiments, the conductive structure 101 comprises one or more of copper, gold, aluminum, or another suitable electrically conductive material. In some embodiments, a distance between the conductive structure 101 and another conductive structure (not shown) is less than 100 micrometers.

Conductive structure 101 connects test circuit 105, via conductive pad 109, to a conductive line 113. In some embodiments, conductive line 113 is a conductive plane. In some embodiments, conductive line 113 is in direct physical contact with conductive structure 101. In some embodiments, conductive line 113 comprises a non-marking material capable of contacting conductive structure 101 without marring the conductive structure 101. In some embodiments, conductive line 113 comprises a flexible material. In some embodiments, conductive line 113 comprises an electrically conductive polymer. In some embodiments, conductive line 113 comprises one or more of copper, gold, aluminum, or another suitable electrically conductive material. The conductive line 113 is electrically connected to ground 115.

In some embodiments, the conductive line 113 optionally comprises a first layer 113*a* and a second layer 113*b* over the first layer 113*a*. The first layer 113*a* is a non-marking conductive material and the second layer 113*b* comprises a metal material electrically coupled with the ground (also referred to as ground voltage source) 115. In some embodiments, first layer 113*a* comprises a conductive polymer.

Test circuit 105 is also connected to a controller 117 and thereby to a bus 127. In some embodiments, controller 117 is a built-in-self test controller configured to coordinate a testing operation which tests the electrical connectivity of the conductive structure 101 to conductive pad 109. In some embodiments, controller 117 is configured to coordinate a testing operation which tests the electrical connectivity of the conductive structure 101 to conductive line 113. In some embodiments, controller 117 is configured to be responsive to a test command. In some embodiments, the controller 117 is configured to receive the test command from a computer coupled with the controller 117 by way of the bus 127. In some embodiments, the computer receives a user instruction to perform the testing operation by way of a user interaction with a user interface associated with the computer. The computer is configured to generate the test command based on the user instruction. The computer is configured to communicate the test command to the controller 117, and the controller is configured to execute the testing operation based on the test command. In some embodiments, the controller 117 is configured to execute the testing operation without receiving the test command or without the computer receiving the user instruction by way of the user input. In some embodiments, the computer is configured to issue the test command without receiving the user instruction by way of the user input or without user interaction with the computer.

The test circuit 105 comprises a voltage supply source V1, an enabling circuit 121, a measurement circuit 119, and a voltage supply node 123 connected between the voltage supply source VA and the enabling circuit 121. Voltage supply node 123 is configured to supply voltage V1 to the enabling circuit 121. The enabling circuit is electrically connected between the voltage supply node 123 and the measurement circuit 119. The measurement circuit 119 is electrically connected to the conductive structure 101 via conductive pad 109.

The enabling circuit 121 is configured to control the supply of a voltage from voltage supply node 123 to measurement circuit 119 responsive to a command from controller 117. In some embodiments, enabling circuit 121 is configured to control activation of test circuit 105 responsive to controller 117.

The measurement circuit 119 is configured to detect a current flow. In some embodiments, measurement circuit 119 is configured to detect an amount of current flow. If the detected amount of current flow meets or exceeds a predetermined current flow amount, the measurement circuit 119 generates an indication that the conductive structure 101 is electrically connected with conductive pad 109. If the detected amount of current flow fails to meet or exceed the predetermined current flow amount, the measurement circuit 119 generates an indication that the conductive structure 101 is not electrically connected with conductive pad 109. In some embodiments, measurement circuit 119 is configured to only generate an indication that the conductive structure 101 is not electrically connected with conductive pad 109. In some embodiments, measurement circuit 119 is configured to only generate an indication that the conductive structure 101 is electrically connected with conductive pad 109.

In some embodiments, measurement circuit 119 is configured to generate an indication that the conductive structure 101 is electrically connected with conductive line 113.

If the detected amount of current flow meets or exceeds a predetermined current flow amount, the measurement circuit 119 generates an indication that the conductive structure 101 is electrically connected with conductive line 113. If the detected amount of current flow fails to meet or exceed the predetermined current flow amount, the measurement circuit 119 generates an indication that the conductive structure 101 is not electrically connected with conductive line 113. In some embodiments, measurement circuit 119 is configured to only generate an indication that the conductive structure 101 is not electrically connected with conductive line 113. In some embodiments, measurement circuit 119 is configured to only generate an indication that the conductive structure 101 is electrically connected with conductive line 113.

The controller 117 is configured to selectively cause the test circuit 105 to supply the voltage V1 to the conductive structure 101. To supply the voltage V1, the controller 117 is configured to selectively actuate the enabling circuit 121 in the test circuit 105 to cause the test circuit 105 to supply the voltage V1 to the conductive structure 101. In some embodiments, enabling circuit 121 comprises one or more of a transistor, a switch, or another suitable circuit usable to selectively cause a voltage to be communicated to facilitate an electrical connection. In some embodiments, the controller 117 is configured to cause the voltage V1 to match an operating voltage of a circuit associated with conductive structure 101.

The test circuit 105 is configured to provide feedback to the controller 117 indicative of whether the conductive structure 101 is electrically connected with the test circuit by way of conductive pad 109. In at least some embodiments, test circuit 105 is configured to detect a current flow from a voltage supply to conductive structure 101 which indicates electrical connection between test circuit 105 and ground 115 by way of the flow of current through conductive structure 101 and conductive line 113. In at least some embodiments, test circuit 105 is configured to generate an indication, provided to controller 117, of electrical connection between conductive structure 101 and conductive pad 109. In at least some embodiments, test circuit 105 is configured to generate an indication, provided to controller 117, of electrical connection between conductive structure 101 and conductive pad 109. In at least some embodiments, test circuit 105 is configured to generate an indication, provided to controller 117, of electrical connection between conductive structure 101 and conductive line 113.

The feedback is based on an output generated by the measurement circuit 119. For example, if the measurement circuit 119 provides feedback to the controller 117 that indicates a current flow from the test circuit 105 through the conductive structure 101 to ground via the conductive line 113, then the controller 117 is configured to determine the conductive structure 101 is electrically connected to test circuit 105. In some embodiments, measurement circuit 119 is configured to measure a current flow through the conductive structure 101 to generate the feedback indicative of electrical connectivity of the conductive structure 101.

In some embodiments, IC testing system 100 optionally includes at least one readout circuit 125 communicatively coupled with the controller 117 and the test circuit 105. Readout circuit 125 is configured to receive the feedback from the test circuit 105 to determine if the conductive structure 101 is capable of carrying the voltage V1 based on the feedback, and to communicate the determination to the controller 117. In some embodiments, readout circuit 125 is configured to receive the feedback from the test circuit 105 to determine if the conductive structure 101 is electrically connected with conductive pad 109 based on the feedback, and to communicate the determination to the controller 117. In some embodiments, readout circuit 125 is configured to receive the feedback from the test circuit 105 to determine if the conductive structure 101 is electrically connected with conductive line 113 based on the feedback, and to communicate the determination to the controller 117.

In some embodiments, the controller 117 is configured to collect the feedback from the test circuit 105 directly, and to determine if the conductive structure 101 is capable of carrying the voltage V1. In some other embodiments, the controller 117 is configured to collect the determination(s) provided from the readout circuit(s) 125. In some embodiments, the controller 117 is configured to generate a report if the feedback/determination indicates that the conductive structure 101 is incapable of carrying the voltage V1. In some embodiments, the controller 117 is configured to generate a report if the feedback/determination indicates that the conductive structure 101 is not electrically connected with conductive pad 109. In some embodiments, the controller 117 is configured to generate a report if the feedback/determination indicates that the conductive structure 101 is not electrically connected with conductive line 113. In some embodiments, the controller 117 is configured to generate a report if the feedback/determination indicates that the conductive structure 101 is capable of carrying the voltage V1. In some embodiments, controller 117 is configured to communicate the report to a computer (not shown) communicatively coupled with controller 117 by a bus 127 or other electrical or communication connection.

In some embodiments, the IC testing system 100 is configured to be used in conjunction with another full functional test of an IC that includes the conductive structure 101. Such a full functional test involves contacting the conductive pad 109 with a test pin. In some embodiments, if the full functional test is being performed, the conductive structure 101 is not being simultaneously tested (i.e., the voltage V1 is not being supplied to another conductive structure) by the IC testing system 100. During the full functional test, measurement circuit 119 is configured to be in a high output impedance state so as to not affect the full functional test of the IC.

Figure 2:
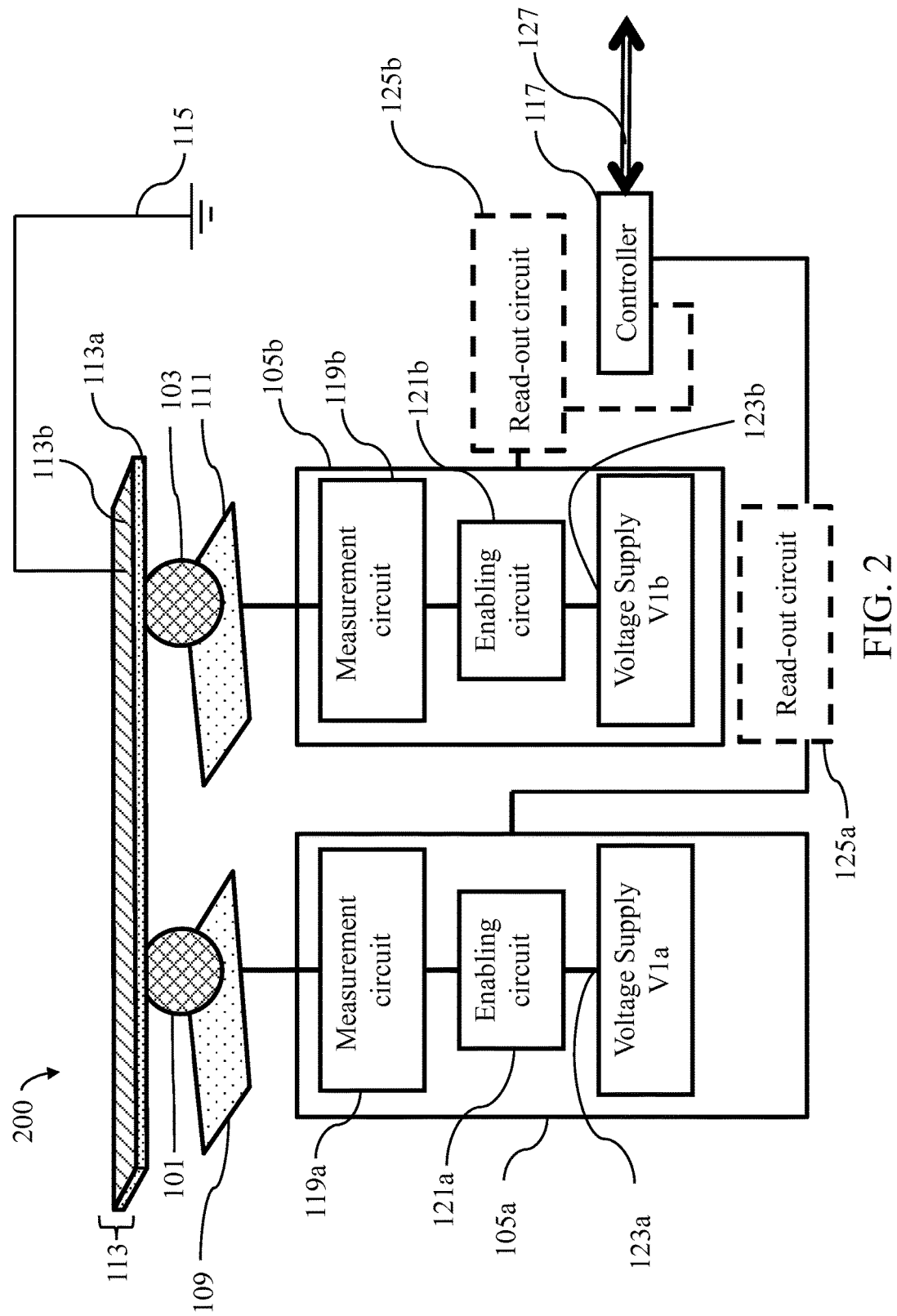
FIG. 2 is a diagram of an IC testing system, in accordance with one or more embodiments.

FIG. 2 is a diagram of an IC testing system 200, in accordance with one or more embodiments. IC testing system 200 comprises two test circuits 105a, 105b. Test circuits 105a, 105b are the same as test circuit 105 (FIG. 1). The components and operation of test circuits 105a, 105b are the same as test circuit 105 (FIG. 1) with the addition of a or b to the reference numerals as appropriate and detailed description thereof is not repeated herein for clarity. IC testing system 200 also comprises a second conductive pad 111 connecting second test circuit 105b with a second conductive structure 103. Second conductive pad 111 is the same as conductive pad 109 and second conductive structure 103 is the same as conductive structure 101. Test circuits 105a, 105b are each connected to controller 117. IC testing system 200 also optionally comprises read-out circuits 125a, 125b. Read-out circuits 125a, 125b are the same as read-out circuit 125 (FIG. 1).

In some embodiments, the conductive structures 101, 103 are spaced by distances of at least 100 micrometers. In some embodiments, the conductive structures 101, 103 are spaced by distances of less than 100 micrometers.

In some embodiments, voltage V1a differs from voltage V1b. In some embodiments, voltage V1a is equal to voltage V1b. In some embodiments, voltage supply node 123a is independent of voltage supply node 123b. In some embodiments, one or more of voltage V1 or voltage V2 is adjustable. In some embodiments, voltage supply node 123a and voltage supply node 123b are components of a voltage supply network configured to supply a test voltage (i.e., the voltage V1 and the voltage V2). In some embodiments, a single voltage supply node supplies voltage to both test circuit 105a and test circuit 105b.

The controller 117 is configured to selectively cause the test circuit 105a to supply the voltage V1a to the conductive structure 101 or to selectively cause the test circuit 105b to supply the voltage V1b to the conductive structure 103. To supply the voltage V1a or the voltage V1b, the controller 117 is configured to selectively actuate the enabling circuit 121a in the test circuit 105a or the enabling circuit 121b in the test circuit 105b to cause the test circuit 105a to supply the voltage V1a to the conductive structure 101 or the test circuit 105b to supply the voltage V1b to the conductive structure 103. In some embodiments, the controller 117 is configured to cause only one of the test circuit 105a to supply the voltage V1a or the test circuit 105b to supply the voltage V1b at a time. In some embodiments, the controller 117 is configured to selectively cause the test circuit 105a and the test circuit 105b to sequentially supply the voltage V1a and the voltage V1b in order. In some embodiments, enabling circuits 121a and 121b independently comprise one or more of a transistor, a switch, or another suitable circuit usable to selectively cause a voltage to be communicated from an input end to and output end to facilitate an electrical connection. In some embodiments, the controller 117 is configured to cause the voltage V1a or the voltage V1b to match an operating voltage of a circuit associated with conductive structure 101 or a circuit associated with conductive structure 103.

In some embodiments, IC testing system 200 optionally includes at least one readout circuit 125a communicatively coupled with the controller 117 and one or more of the test circuit 105a or the second test circuit 105b. In some embodiments, IC testing system 200 includes an additional readout circuit 125b. If IC testing system 200 includes multiple readout circuits, readout circuit 125a is communicatively coupled with test circuit 105a and with the controller 117, and readout circuit 125b is communicatively coupled with test circuit 105b and with the controller 117. Readout circuits 125a and 125b are collectively referred to as readout circuit 125 herein. Readout circuit 125 is configured to receive the feedback from the test circuit 105a or the test circuit 105b, to determine if the conductive structure 101 or the conductive structure 103 is capable of carrying the voltage V1a or the voltage V1b based on the feedback, and to communicate the determination to the controller 117.

In some embodiments, the controller 117 is configured to collect the feedback from the test circuit 105a and/or the test circuit 105b directly, and to determine if the first conductive structure 101 and/or the second conductive structure 103 is capable of carrying the voltage V1a or the second voltage V1b. Alternatively, the controller 117 is configured to collect the determination(s) provided from the readout circuit(s) 125. In some embodiments, the controller 117 is configured to generate a report if the feedback/determination indicates at least one of the conductive structure 101 or the conductive structure 103 is incapable of carrying the voltage V1a or the voltage V1b. In some embodiments, the controller 117 is configured to generate a report if the feedback/determination indicates at least one of the conductive structure 101 or the conductive structure 103 is capable of carrying the voltage V1a or the second voltage V1b. In some embodiments, the controller 117 is configured to generate a report indicating that one of the conductive structure 101 or the conductive structure 103 is incapable of carrying the voltage V1a or the voltage V1b, and the other of the conductive structure 101 or the conductive structure 103 is capable of carrying the voltage V1a or the voltage V1b. In some embodiments, controller 117 is configured to communicate the report to a computer (not shown) communicatively coupled with controller 117 by a bus 127 or other electrical or communication connection.

In some embodiments, conductive structure 101 and conductive structure 103 comprise different structure types and/or different conductive materials. For example, in some embodiments, conductive structure 101 is a bump ball and conductive structure 103 is a conductive pillar. In some embodiments, a distance between conductive structure 101 and the conductive structure 103 is less than 100 micrometers.

In some embodiments, one or more of conductive pad 109 or conductive pad 111 are under bump layers. In some embodiments, conductive pad 109 and conductive pad 111 comprise one or more of copper, gold, aluminum or another suitable electrically conductive material.

In some embodiments, conductive line 113 is in direct physical contact with one or more of the conductive structure 101 or the conductive structure 103.

In some embodiments, the IC testing system 200 is configured to be used in conjunction with another full functional test of an IC that includes the conductive structure 101 and the conductive structure 103. Such a full functional test involves contacting the conductive pad 109 or the conductive pad 111 with a test pin. In some embodiments, if the full functional test is being performed, the conductive structure 101 and the second conductive structure 103 are not being simultaneously tested (i.e., the voltage V1a or the voltage V1b is not being supplied to the conductive structure 101 or the conductive structure 103) by the IC testing system 200. During the full functional test, measurement circuit 119a and measurement circuit 119b are configured to be in a high output impedance state so as to not affect the full functional test of the IC.

Figure 3:
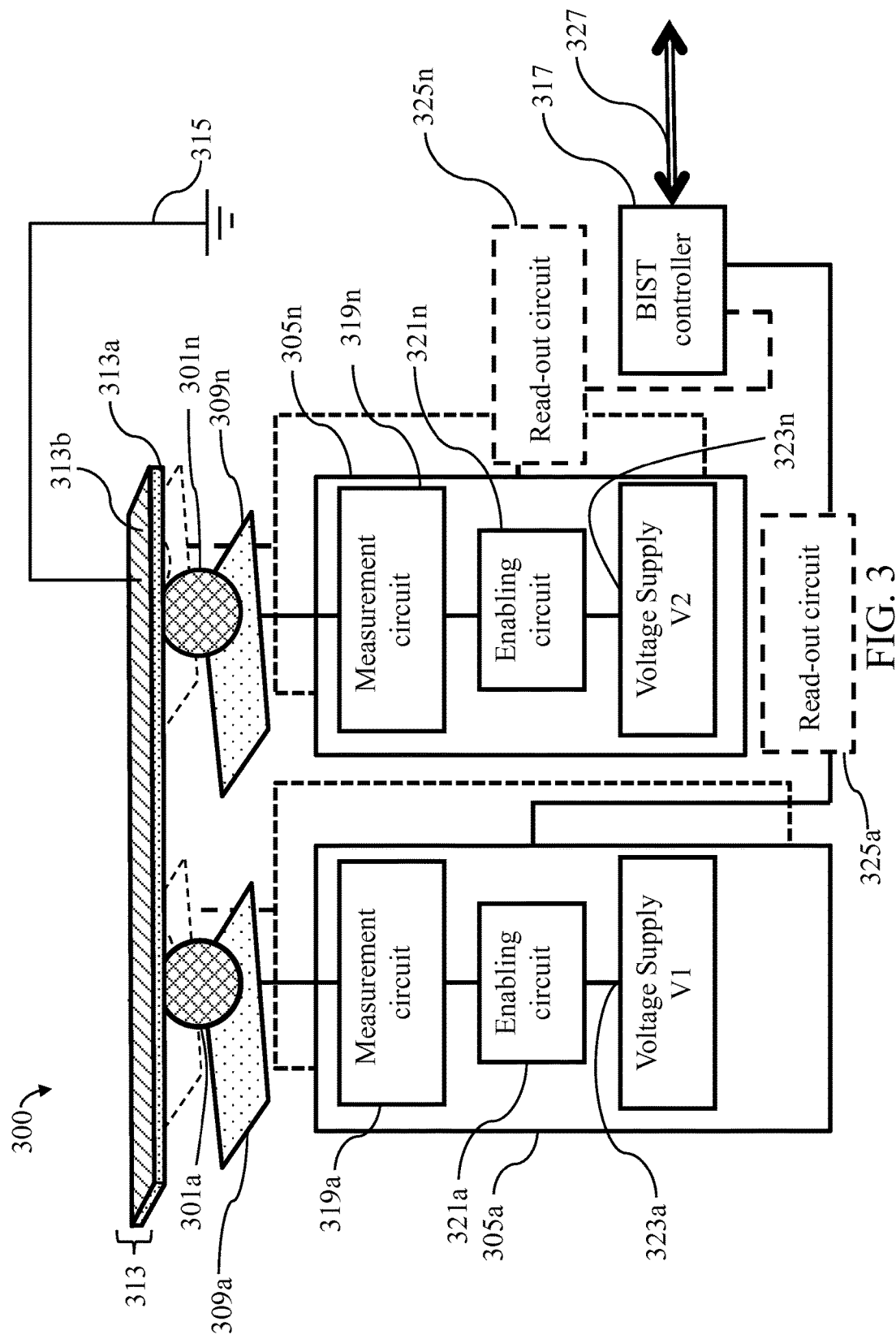
FIG. 3 is a diagram of an IC testing system, in accordance with one or more embodiments.

FIG. 3 is a diagram of an IC testing system 300, in accordance with one or more embodiments. IC testing system 300 comprises features similar to those discussed with respect to IC testing system 200 (FIG. 2), with the reference numerals increased by 200. IC testing system 300 differs from IC testing system 200 in that IC testing system 300 is a grid array that includes a plurality of conductive structures 301a-301n (collectively referred to as conductive structures 301), a plurality of test circuits 305a-305n (collectively referred to as test circuits 305), and a plurality of conductive pads 309a-309n. Conductive plane 313 is electrically connected with the conductive structures 301. In IC testing system 300, each conductive structure 301 is tested by causing a voltage to be supplied to at least one of the conductive structures 301 by a respective test circuit 305 to determine if the conductive structure 301 having the voltage supplied to the conductive structure 301 is capable of carrying the voltage supplied to that conductive structure 301. Controller 317 is configured to selectively cause the test circuits 305 to supply the voltage to the conductive structures 301. In some embodiments, the controller 317 is configured to cause only one of the test circuits 305 to supply the test voltage at a time. In some embodiments, the controller 317 is configured to selectively cause the test circuits 305 sequentially supply the test voltage in order so as to individually test each conductive structure 301 included in the grid array.

Figure 4:
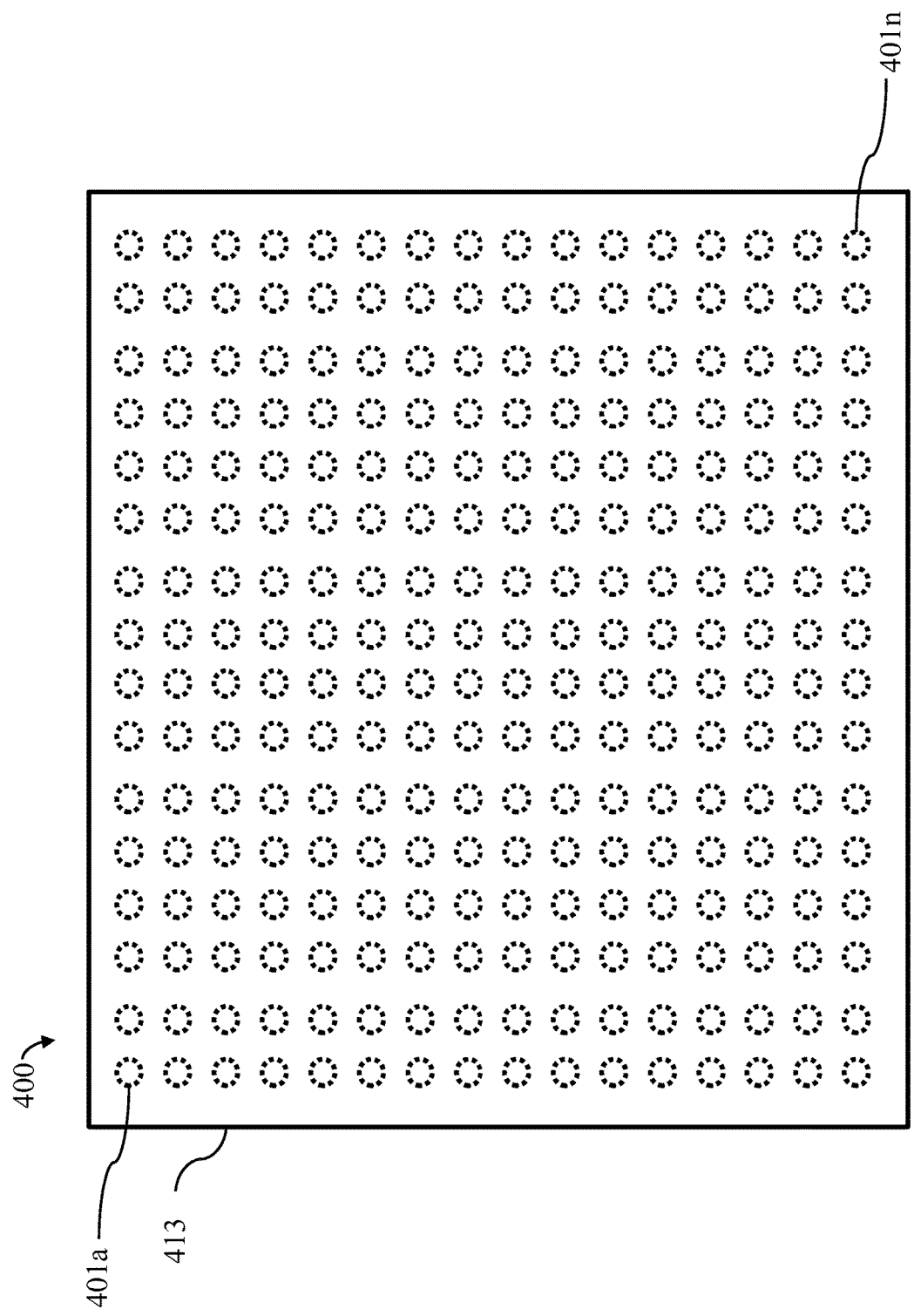
FIG. 4 is a top-side view of an IC testing system, in accordance with one or more embodiments.

FIG. 4 is a top-side view of an IC testing system 400, in accordance with one or more embodiments. IC testing system 400 comprises many of the features discussed with respect to IC testing system 100 (FIG. 1), with the reference numerals increased by 300. IC testing system 400 includes conductive structures 401a-401n arranged in a grid array. Conductive plane 413 is continuous over all of the conductive structures 401a-401n and contacts all of the conductive structures 401a-401n.

Figure 5:
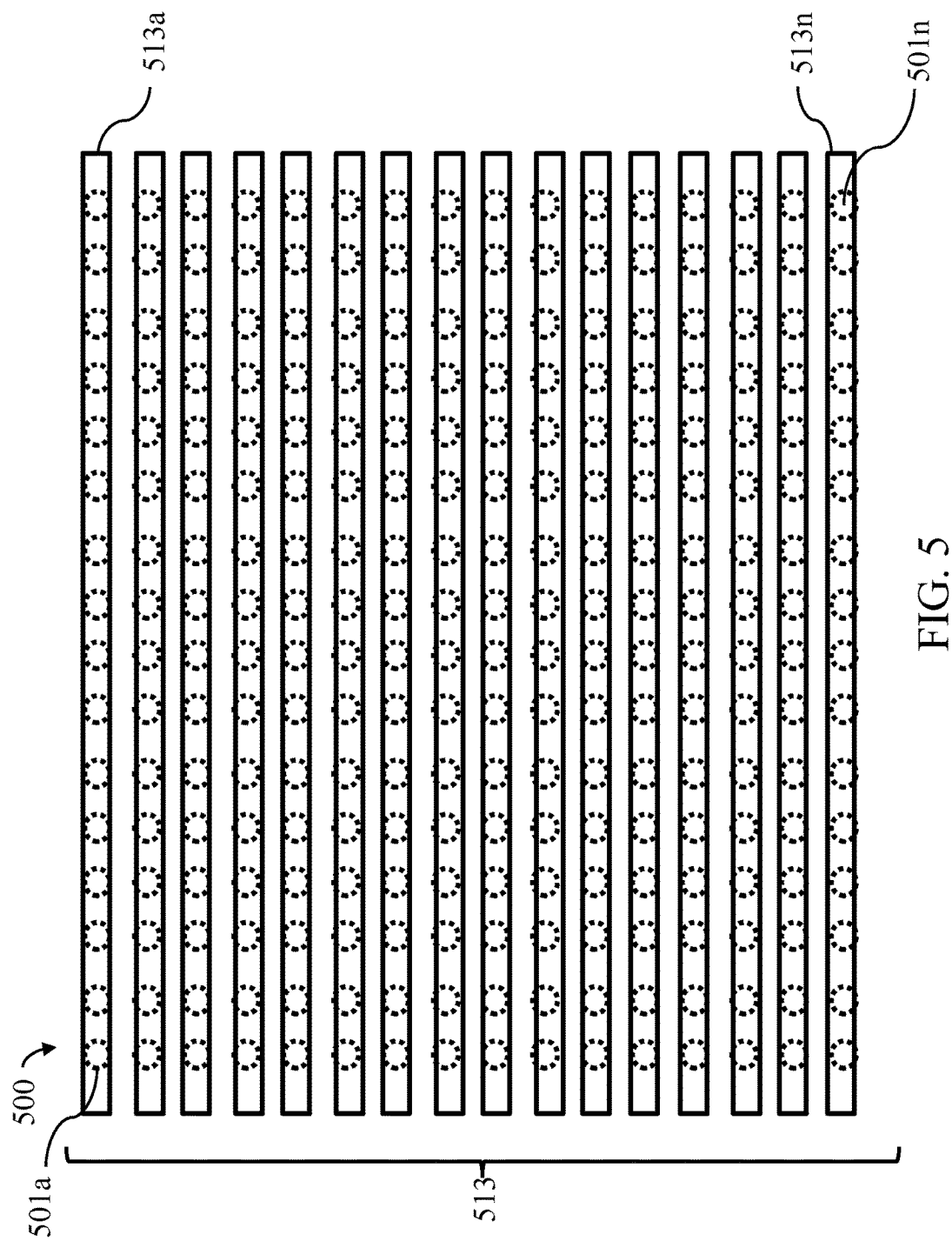
FIG. 5 is a top-side view of an IC testing system, in accordance with one or more embodiments.

FIG. 5 is a top-side view of an IC testing system 500, in accordance with one or more embodiments. IC testing system 500 comprises features similar to those discussed with respect to IC testing system 400 (FIG. 4), with the reference numerals increased by 100. IC testing system 500 differs from IC testing system 400 in that IC testing system 500 includes a conductive plane 513 that comprises a plurality of separate sub-planes 513a-513n (collectively referred to as sub-planes 513). Sub-planes 513 each extend across the grid array and contact conductive structures 501 that are each arranged in a single row of the grid array.

Figure 6:
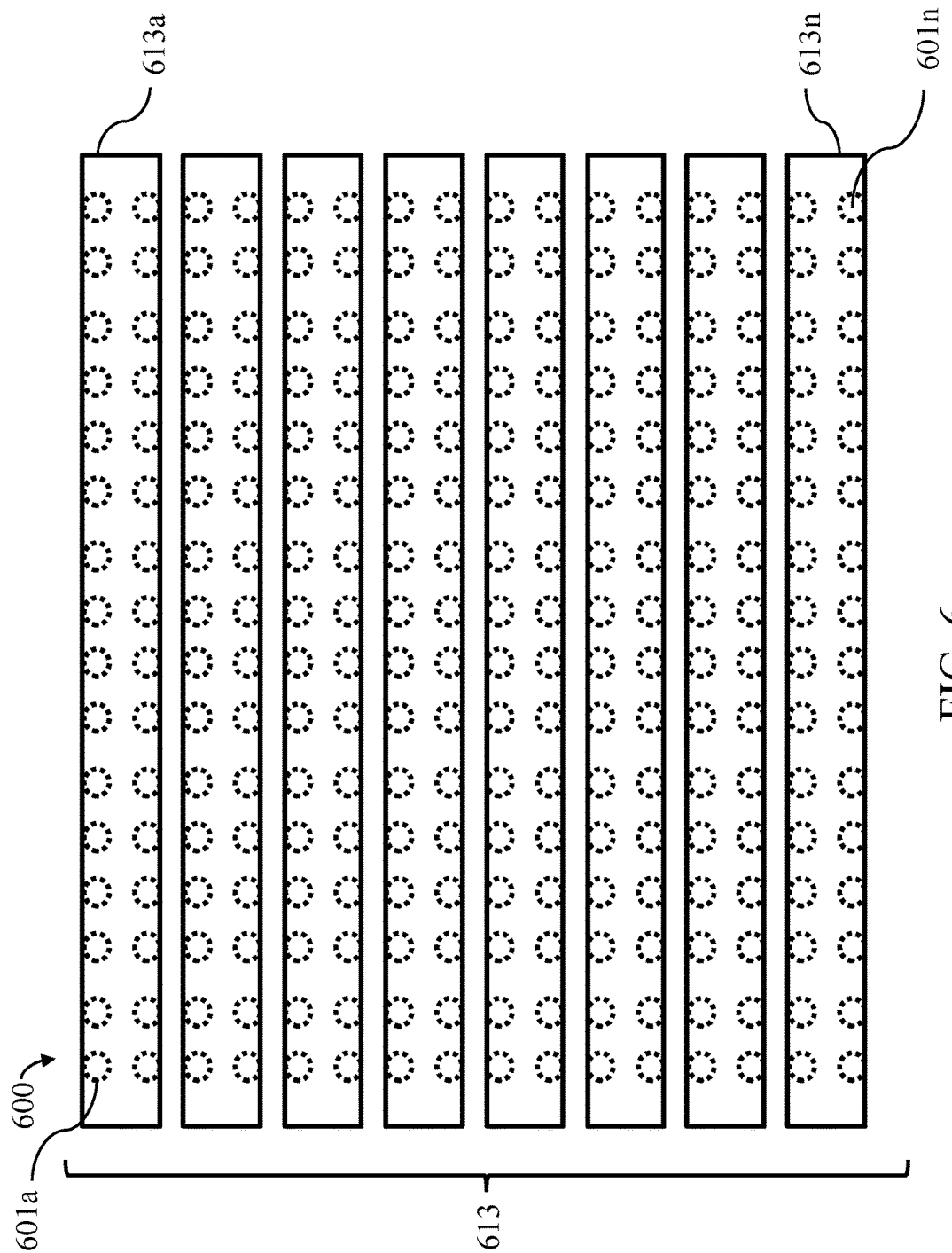
FIG. 6 is a top-side view of an IC testing system, in accordance with one or more embodiments.

FIG. 6 is a top-side view of an IC testing system 600, in accordance with one or more embodiments. IC testing system 600 comprises features similar to those discussed with respect to IC testing system 500 (FIG. 5), with the reference numerals increased by 100. IC testing system 600 differs from IC testing system 500 in that IC testing system 600 includes a conductive plane 613 that comprises sub-planes 613a-613n that each extend across the grid array and contact conductive structures 601 that are each arranged in multiple rows of the grid array. While the sub-planes 613a-613n are illustrated as each contacting conductive structures 601 in two rows of the grid array, different embodiments of the IC testing system 600 include sub-planes 613a-613n that contact more than two rows of conductive structures 601. In some embodiments, all of the sub-planes 613a-613n are configured to contact an equal number of rows of conductive structures 601. In some embodiments, IC testing system 600 includes one or more sub-planes 613a-613n that are configured to contact different quantities of rows of conductive structures 601. In some embodiments, at least one of the sub-planes 613a-613n is configured to contact one row of conductive structures 601 and the other of the sub-planes 613a-613n are configured to contact more than one row of conductive structures 601.

Figure 7:
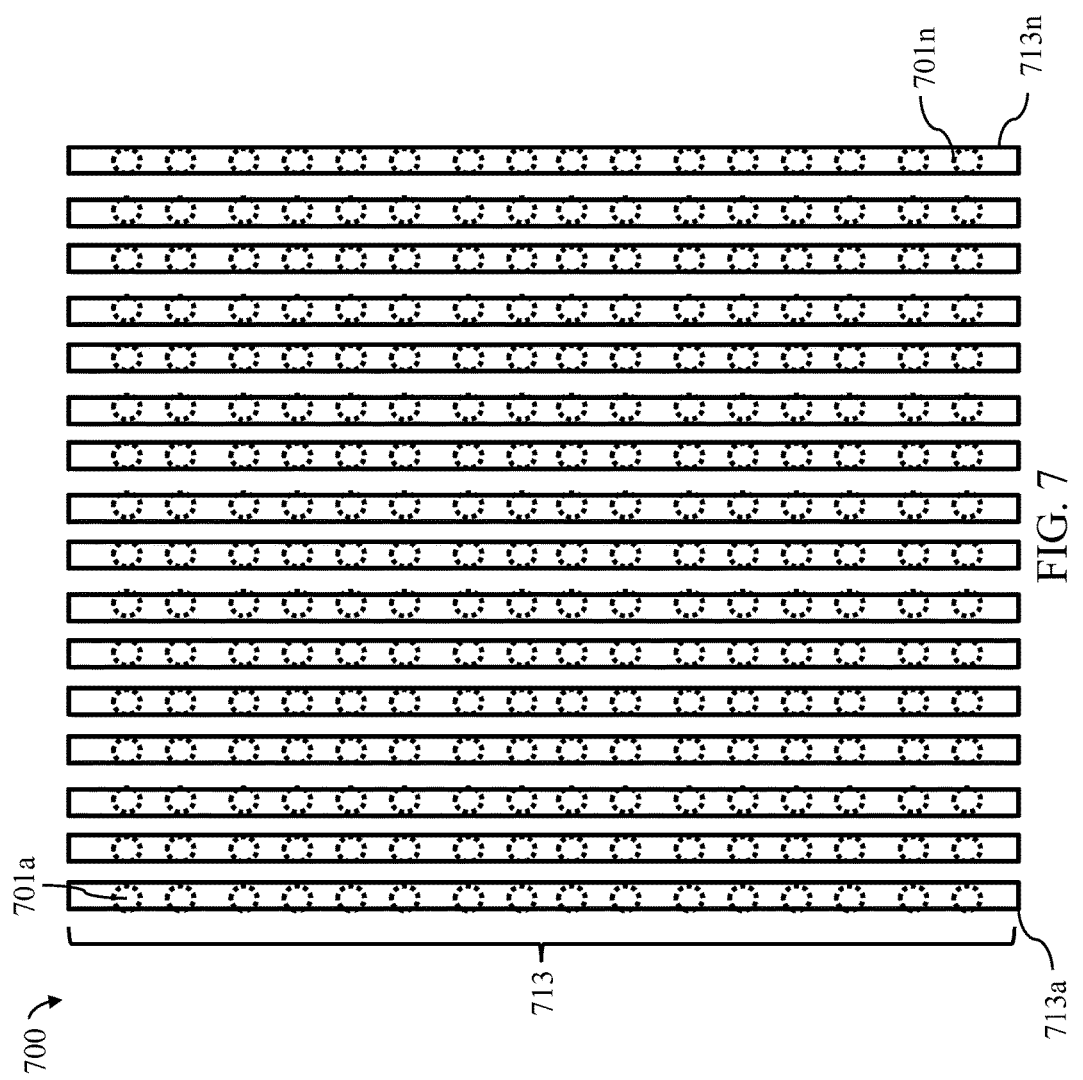
FIG. 7 is a top-side view of an IC testing system, in accordance with one or more embodiments.

FIG. 7 is a top-side view of an IC testing system 700, in accordance with one or more embodiments. IC testing system 700 comprises features similar to those discussed with respect to IC testing system 400 (FIG. 4), with the reference numerals increased by 300. IC testing system 700 differs from IC testing system 400 in that IC testing system 700 includes a conductive plane 713 that comprises a plurality of separate sub-planes 713a-713n. Sub-planes 713a-713n each extend across the grid array and contact conductive structures 701 that are each arranged in a single column of the grid array.

Figure 8:
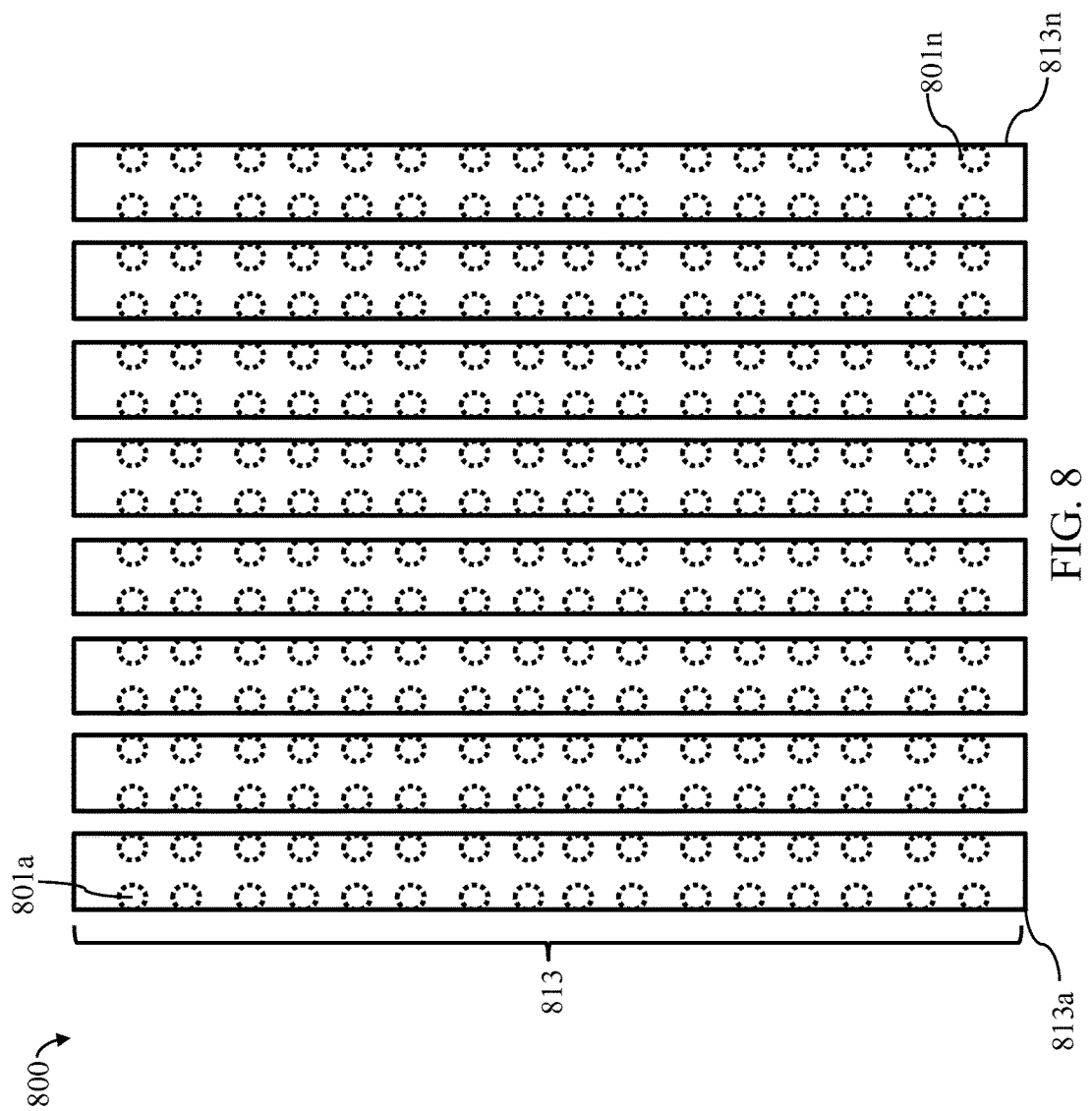
FIG. 8 is a top-side view of an IC testing system, in accordance with one or more embodiments.

FIG. 8 is a top-side view of an IC testing system 800, in accordance with one or more embodiments. IC testing system 800 comprises features similar to those discussed with respect to IC testing system 700 (FIG. 7), with the reference numerals increased by 100. IC testing system 800 differs from IC testing system 700 in that IC testing system 800 includes a conductive plane 813 that comprises sub-planes 813a-813n that each extend across the grid array and contact conductive structures 801 that are each arranged in multiple columns of the grid array. While the sub-planes 813a-813n are illustrated as each contacting conductive structures 801 in two columns of the grid array, different embodiments of the IC testing system 800 include sub-planes 813a-813n that contact more than two columns of conductive structures 801. In some embodiments, all of the sub-planes 813a-813n are configured to contact an equal number of columns of conductive structures 801. In some embodiments, IC testing system 800 includes one or more sub-planes 813a-813n that are configured to contact different quantities of columns of conductive structures 801. In some embodiments, at least one of the sub-planes 813a-813n is configured to contact one column of conductive structures 801 and the other of the sub-planes 813a-813n are configured to contact more than one column of conductive structures 801.

Figure 9:
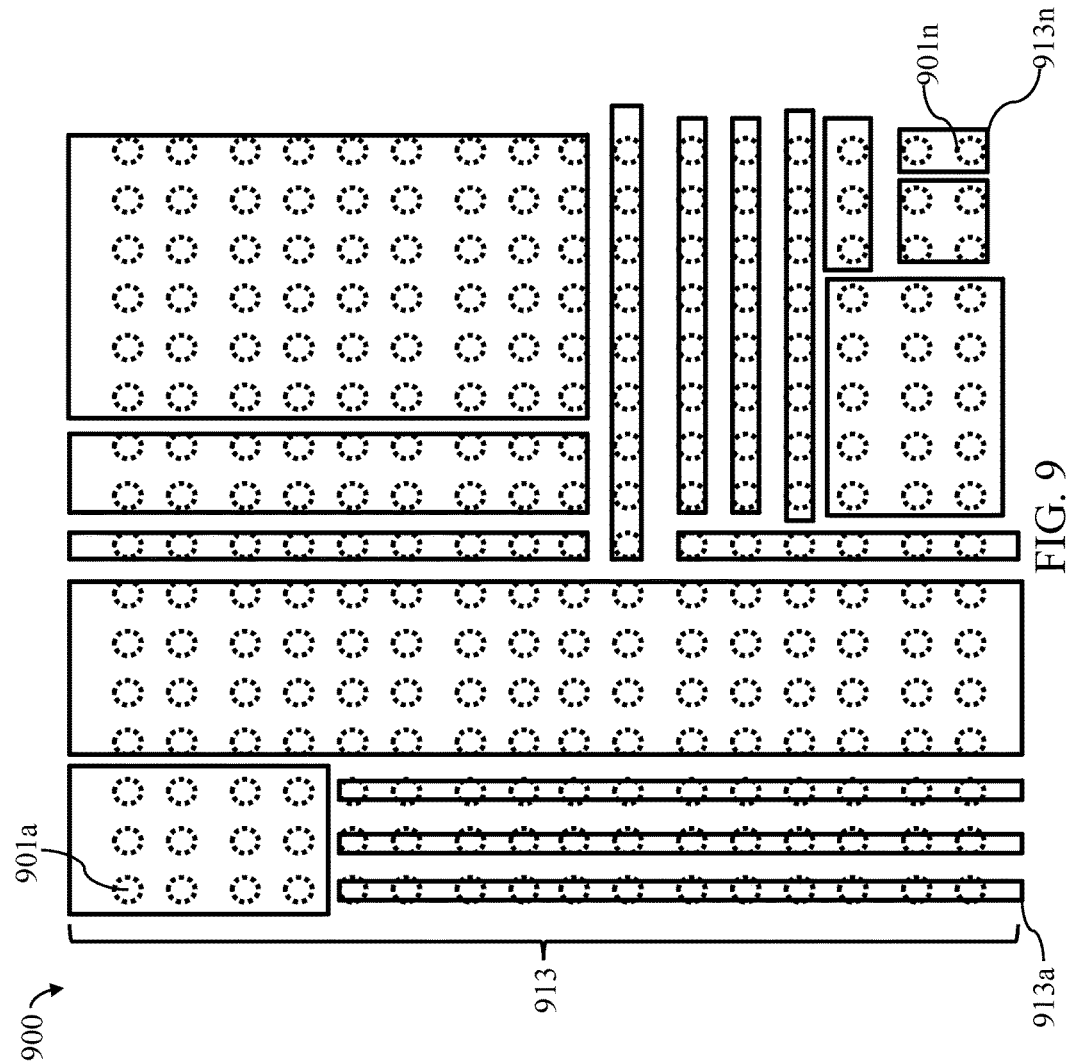
FIG. 9 is a top-side view of an IC testing system, in accordance with one or more embodiments.

FIG. 9 is a top-side view of an IC testing system 900, in accordance with one or more embodiments. IC testing system 900 comprises features similar to those discussed with respect to IC testing system 400 (FIG. 4), with the reference numerals increased by 500. IC testing system 900 differs from IC testing system 400 in that IC testing system 900 includes a conductive plane 913 that comprises a plurality of separate sub-planes 913a-913n. Sub-planes 913a-913n each contact various quantities of conductive structures 901 that are each arranged in columns and/or rows of the grid array.

FIG. 10 is a flowchart of a method 1000 of testing an IC, in accordance with one or more embodiments. Method 1000 is usable to determine if one or more conductive structures included in an IC are capable of carrying a voltage supplied to the conductive structures. In some embodiments, method 1000 is usable to determine if one or more conductive structures included in an IC are capable of carrying a voltage supplied to the conductive structures without the use of a test pin. In step 1001, a first conductive structure such as conductive structure 105a (FIG. 2) and a second conductive structure such as conductive structure 105b are caused to be electrically connected to a conductive line. In step 1003, a first voltage such as voltage V1a (FIG. 2) is supplied to the first conductive structure to determine if the first conductive structure is capable of carrying the first voltage. In step 1005, a second voltage such as voltage V1b is supplied to the second conductive structure to determine if the second conductive structure is capable of carrying the second voltage. In step 1007, a report is generated indicating whether one or more of the first conductive structure or the second conductive structure is incapable of carrying the first voltage or the second voltage based on feedback received from the one or more test circuits. In some embodiments, a report is generated indicating whether one or more of the first conductive structure or the second conductive structure is capable of carrying the first voltage or the second voltage based on feedback received from one or more test circuits individually coupled with the first conductive structure and the second conductive structure. In some embodiments, a report is generated indicating whether one of the first conductive structure or the second conductive structure is capable of carrying the first voltage or the second voltage and the other of the first conductive structure or the second conductive structure is incapable of carrying the first voltage or the second voltage based on feedback received from the one or more test circuits. In some embodiments, a controller causes the first voltage to be supplied to the first conductive structure at a time before the controller causes the second voltage to be supplied to the second conductive structure. In some embodiments the controller causes only one of the first voltage to be supplied to the first conductive structure or the second voltage to be supplied to the second conductive structure at a time.

An aspect of this description is related to an integrated circuit testing system includes a conductive structure, a conductive pad electrically connected with the conductive structure, a test circuit electrically connected with the conductive pad, a conductive line electrically connected with the conductive structure, the conductive line being configured to be connected with a ground, and a controller coupled with the test circuit. The controller is configured to selectively cause the test circuit to supply a voltage to the conductive structure via the conductive pad. The test circuit is configured to provide feedback to the controller indicative of whether the conductive structure is electrically connected with the conductive pad.

Another aspect of this description is related to an IC testing system, comprising a first conductive bump structure, a second conductive bump structure separated from the first conductive bump structure, a first test circuit comprising a first current measurement circuit electrically connected with the first conductive bump structure, and a second test circuit comprising a second current measurement circuit electrically connected with the second conductive bump structure. The IC testing system also comprises a conductive line electrically connected with the first conductive bump structure and with the second conductive bump structure. The conductive line is configured to carry a ground voltage. The IC testing system further comprises a controller coupled with the first test circuit and with the second test circuit. The controller is configured to selectively cause the first test circuit to supply a first voltage to the first conductive bump structure or the second test circuit to supply a second voltage to the second conductive bump structure. The first test circuit is configured to provide feedback to the controller based on an output generated by the current measurement circuit. The feedback is indicative of whether the first conductive bump structure is electrically connected with the conductive line. The second test circuit is configured to provide feedback to the controller based on an output generated by the second current measurement circuit. The feedback is indicative of whether the second conductive bump structure is electrically connected with the conductive line.

A further aspect of this description is related to a method of testing an IC. The method comprises electrically connecting a first conductive structure and a second conductive structure to a conductive line. The method also comprises supplying a first voltage to the first conductive structure to determine if the first conductive structure is capable of carrying the first voltage. The method further comprises supplying a second voltage to the second conductive structure to determine if the second conductive structure is capable of carrying the second voltage. The method additionally comprises generating a report indicating one or more of the first conductive structure or the second conductive structure is incapable of carrying the first voltage or the second voltage based on feedback received from one or more test circuits individually coupled with the first conductive structure and with the second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit testing system, comprising:
    a conductive line connected to a node configured to have a ground voltage; and
    an integrated circuit comprising:
        a conductive structure;
        a conductive pad;
        a test circuit electrically connected with the conductive pad; and
        a controller coupled with the test circuit, the controller being configured to selectively cause the test circuit to supply a voltage to the conductive structure via the conductive pad,
    wherein
        the conductive structure is positioned between the conductive line and the conductive pad, wherein the conductive structure is the only conductive structure that is between the node and the test circuit,
        the conductive line and the conductive pad are positioned between the node and the test circuit, and
        the test circuit is configured to provide feedback to the controller indicative of whether the conductive structure is electrically connected with the conductive pad.

2. The integrated circuit testing system of claim 1, wherein the test circuit is further configured to provide feedback to the controller indicative of whether the conductive structure is electrically connected with the conductive pad based on a current flow.

3. The integrated circuit testing system of claim 2, wherein the test circuit is further configured to provide feedback to the controller indicative of whether the conductive structure is electrically connected with the conductive pad based on a measurement of the current flow exceeding a predetermined threshold value.

4. The integrated circuit testing system of claim 1, wherein the test circuit comprises:
    a measurement circuit electrically connected to the conductive pad;
    an enabling circuit electrically connected to the measurement circuit and to the controller; and
    a voltage supply node electrically connected to the enabling circuit and configured to supply a voltage,
    wherein the controller is configured to selectively actuate the enabling circuit to cause the test circuit to supply the voltage to the conductive pad, and the feedback is based on an output generated by the measurement circuit.

5. The integrated circuit testing system of claim 1, wherein the integrated circuit further comprises:
    at least one readout circuit communicatively coupled with the controller and the test circuit,
    wherein the at least one readout circuit is configured to receive the feedback from the test circuit, to determine if the conductive pad is electrically connected with the conductive structure based on the feedback, and to communicate the determination to the controller.

6. The integrated circuit testing system of claim 1, wherein the controller is configured to collect the feedback and to generate a report if the feedback is indicative of the conductive structure being electrically disconnected from the conductive pad.

7. The integrated circuit testing system of claim 1, wherein the conductive structure is a bump ball.

8. The integrated circuit testing system of claim 7, wherein the bump ball comprises solder.

9. The integrated circuit testing system of claim 1, wherein the conductive line is a flexible material.

10. The integrated circuit testing system of claim 9, wherein the flexible material is a non-marking material.

11. The integrated circuit testing system of claim 1, wherein the conductive line is a conductive polymer.

12. The integrated circuit testing system of claim 1, wherein the conductive line comprises a first layer and a second layer over the first layer, the first layer is a non-marking conductive material and the second layer comprises a metal material electrically coupled with the ground.

13. The integrated circuit testing system of claim 12, wherein the metal material is copper.

14. An integrated circuit testing system, comprising:
a conductive line configured to carry a ground voltage; and
an integrated circuit comprising:
a first conductive bump structure, wherein the conductive line is configured to contact the first conductive bump structure;
a second conductive bump structure separated from the first conductive bump structure, wherein the conductive line is configured to contact the second conductive bump structure;
a first test circuit comprising a first current measurement circuit electrically connected with the first conductive bump structure;
a second test circuit comprising a second current measurement circuit electrically connected with the second conductive bump structure; and
a controller coupled with the first test circuit and with the second test circuit, the controller being configured to:
selectively cause the first test circuit to supply a first voltage to the first conductive bump structure, the first voltage being different from the ground voltage; or
selectively cause the second test circuit to supply a second voltage to the second conductive bump structure, the second voltage being different from the ground voltage, wherein
the first test circuit is configured to provide a first test result from the first current measurement circuit electrically connected with the first conductive bump structure to the controller based on an output generated by the first current measurement circuit, the first test result being indicative of whether the first conductive bump structure is electrically connected with the conductive line, and
the second test circuit is configured to provide a second test result from the second current measurement circuit electrically connected with the second conductive bump structure to the controller based on an output generated by the second current measurement circuit, the second test result being indicative of whether the second conductive bump structure is electrically connected with the conductive line.

15. The integrated circuit testing system of claim 14, wherein the integrated circuit further comprises:
a first under bump layer between the first conductive bump structure and the first test circuit; and
a second under bump layer between the second conductive bump structure and the second test circuit,
wherein
the first conductive bump structure is over the first under bump layer, the first conductive bump structure is in contact with the first under bump layer, and the first test circuit is electrically connected to the first under bump layer, and
the second conductive bump structure is over the second under bump layer, the second conductive bump structure is in contact with the second under bump layer, and the second test circuit is electrically connected to the second under bump layer.

16. The integrated circuit testing system of claim 15, wherein the first under bump layer comprises an electrically conductive material.

17. The integrated circuit testing system of claim 14, wherein at least one of the first conductive bump structure or the second conductive bump structure comprises a curved surface.

18. A method of testing an integrated circuit, the method comprising:
electrically connecting a first conductive structure of the integrated circuit and a second conductive structure of the integrated circuit to a conductive line having a ground voltage;
supplying a first voltage from the integrated circuit to the first conductive structure to determine if the first conductive structure is capable of carrying the first voltage, the first voltage being different from the ground voltage;
supplying a second voltage from the integrated circuit to the second conductive structure to determine if the second conductive structure is capable of carrying the second voltage, the second voltage being different from the ground voltage; and
using a controller of the integrated circuit, generating a report indicating whether one or more of the first conductive structure or the second conductive structure is incapable of carrying the first voltage or the second voltage based on feedback received from a first test circuit individually coupled with the first conductive structure, the first test circuit is configured to output a first test result indicative of whether the first conductive structure is incapable of carrying the first voltage, and a second test circuit individually coupled with the second conductive structure, the second test circuit is configured to output a second test result indicative of whether the second conductive structure is incapable of carrying the second voltage.

19. The method of claim 18, wherein the controller causes the first voltage to be supplied to the first conductive structure at a time before the second voltage is supplied to the second conductive structure.

20. The method of claim 18, wherein the controller causes only one of the first voltage to be supplied to the first conductive structure or the second voltage to be supplied to the second conductive structure at a time.

* * * * *